(12) United States Patent
Burski et al.

(10) Patent No.: US 11,387,583 B2
(45) Date of Patent: Jul. 12, 2022

(54) FLEXIBLE TO BASE CONNECTOR

(71) Applicant: Seagate Technology LLC, Fremont, CA (US)

(72) Inventors: Brian Lee Burski, Loveland, CO (US); Ted R. McDonald, Louisville, CO (US); Chau Chin Low, Fremont, CA (US)

(73) Assignee: SEAGATE TECHNOLOGY LLC, Fremont, CA (US)

(*) Notice: Subject to any disclaimer, the term of this patent is extended or adjusted under 35 U.S.C. 154(b) by 0 days.

(21) Appl. No.: 17/024,115

(22) Filed: Sep. 17, 2020

(65) Prior Publication Data

US 2022/0085534 A1    Mar. 17, 2022

(51) Int. Cl.
*H01R 12/79*   (2011.01)
*H01R 13/622*  (2006.01)

(52) U.S. Cl.
CPC ........... *H01R 12/79* (2013.01); *H01R 13/622* (2013.01)

(58) Field of Classification Search
CPC .... H01R 23/725; H01R 9/096; H01R 13/622; H01R 12/79

USPC .......................................................... 439/74
See application file for complete search history.

(56) References Cited

U.S. PATENT DOCUMENTS

| | | | |
|---|---|---|---|
| 5,064,377 A | 11/1991 | Wood | |
| 7,187,518 B2* | 3/2007 | Hong | H05K 3/365 360/99.08 |
| 7,855,136 B2 | 12/2010 | Takahira | |
| 2005/0018352 A1 | 1/2005 | Hong et al. | |
| 2011/0050011 A1 | 3/2011 | Rhee et al. | |
| 2012/0113546 A1 | 5/2012 | Sugi et al. | |
| 2013/0119536 A1 | 5/2013 | Hada et al. | |

* cited by examiner

*Primary Examiner* — Gary F Paumen
(74) *Attorney, Agent, or Firm* — Westman, Champlin & Koehler, P.A.

(57) ABSTRACT

A connector includes a flexible connector having a first plurality of solder bumps arranged in a first pattern, and a base connector having a second plurality of solder bumps arranged in a second pattern concentric with and of a different size than the first pattern. A method of interconnecting a flexible connector to a base connector includes providing the flexible connector with a first plurality of solder bumps arranged in a first pattern, and providing the base connector with a second plurality of solder bumps arranged in a second pattern. The flexible and base connectors are aligned by aligning the first and second pluralities of solder bumps.

17 Claims, 6 Drawing Sheets

FLEXIBLE TO BASE CONNECTOR

SUMMARY

In one embodiment, a flexible to printed circuit board connector includes a flexible connector having a first plurality of solder bumps arranged in a first pattern, and a base connector having a second plurality of solder bumps arranged in a second pattern concentric with and of a different size than the first pattern.

In another embodiment, a method of interconnecting a flexible connector to a base connector includes providing the flexible connector with a first plurality of solder bumps arranged in a first pattern, and providing the base connector with a second plurality of solder bumps arranged in a second pattern. The flexible and base connectors are aligned by aligning the first and second pluralities of solder bumps.

In another embodiment, a flexible to printed circuit board connector includes a flexible connector having a first plurality of solder bumps arranged in a first pattern, and a printed circuit board having a base connector. The base connector has a second plurality of solder bumps arranged in a second pattern concentric with and of a different size than the first pattern.

This summary is not intended to describe each disclosed embodiment or every implementation of a flexible connector and a base connector combination as described herein. Many other novel advantages, features, and relationships will become apparent as this description proceeds. The figures and the description that follow more particularly exemplify illustrative embodiments.

DETAILED DESCRIPTION OF ILLUSTRATIVE EMBODIMENTS

Embodiments of the present disclosure provide a connector including a flexible connector (e.g., a motor connector) to a base connector, for example on a printed circuit board (PCB) which is typically rigid. A series of solder bumps on the flexible connector are offset from another set of solder bumps on the base connector. The flexible connector is wedged to the PCB in a process that aligns and locks the flexible connector properly to the PCB. A screw at a center of the solder bumps may be used for compression of the flexible connector to the base connector.

It should be noted that the same reference numerals are used in different figures for same or similar elements. It should also be understood that the terminology used herein is for the purpose of describing embodiments, and the terminology is not intended to be limiting. Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "bottom," "forward," "reverse," "clockwise," "counter clockwise," "up," "down," or other similar terms such as "upper," "lower," "aft," "fore," "vertical," "horizontal," "proximal," "distal," "intermediate" and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

It will be understood that, when an element is referred to as being "connected," "coupled," or "attached" to another element, it can be directly connected, coupled or attached to the other element, or it can be indirectly connected, coupled, or attached to the other element where intervening or intermediate elements may be present. In contrast, if an element is referred to as being "directly connected," "directly coupled" or "directly attached" to another element, there are no intervening elements present. Drawings illustrating direct connections, couplings or attachments between elements also include embodiments, in which the elements are indirectly connected, coupled or attached to each other.

Figure 1:
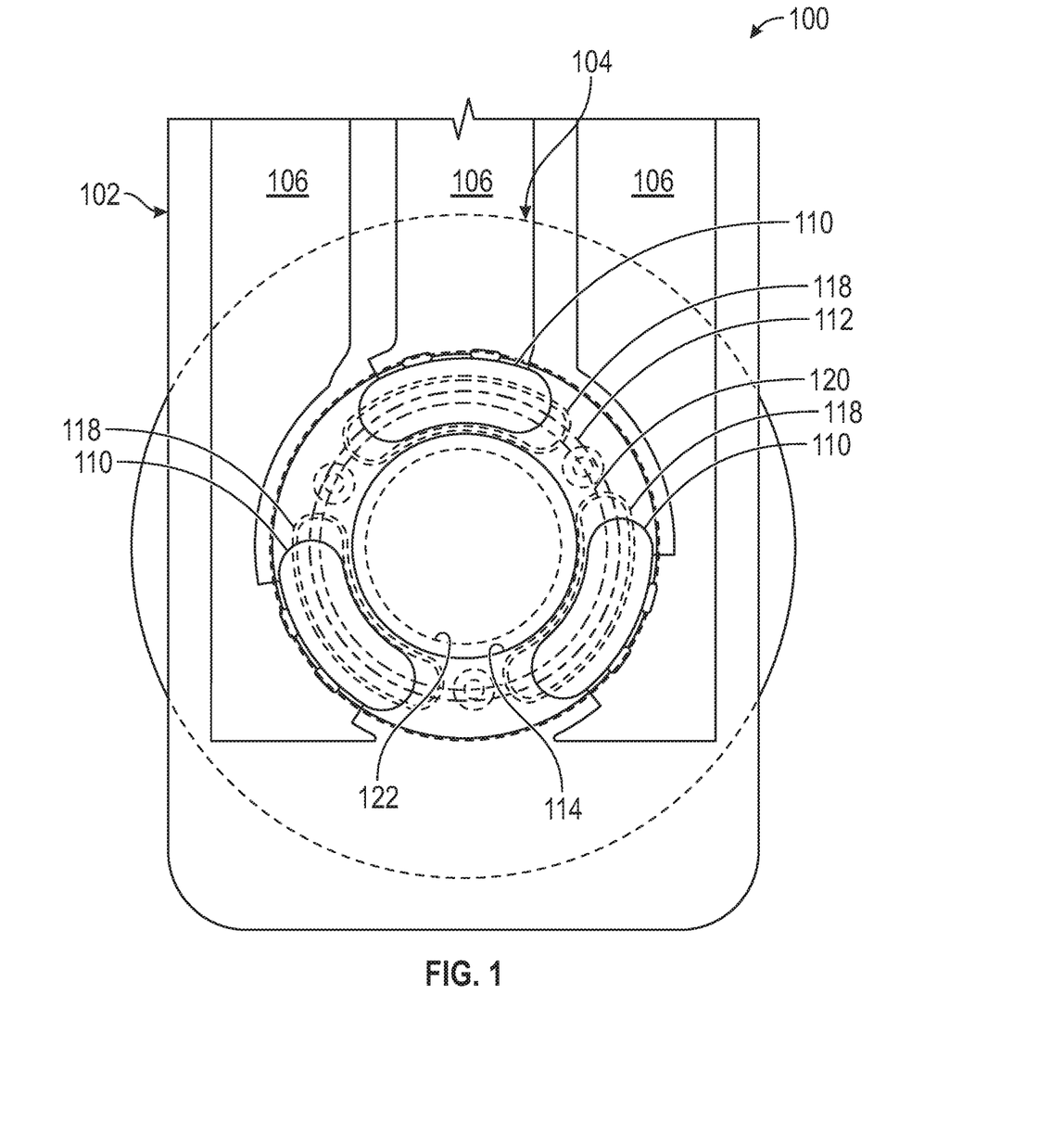
FIG. 1 is a top plan view of a flexible to base connector according to an embodiment of the present disclosure.
Figure 2A:
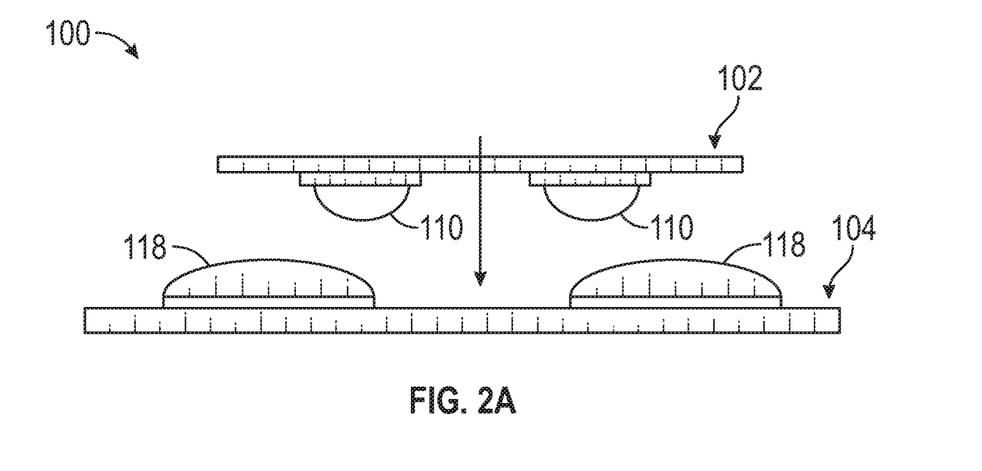
FIGS. 2A and 2B are side views showing assembly of the flexible to base connector of FIG. 1.
Figure 2B:
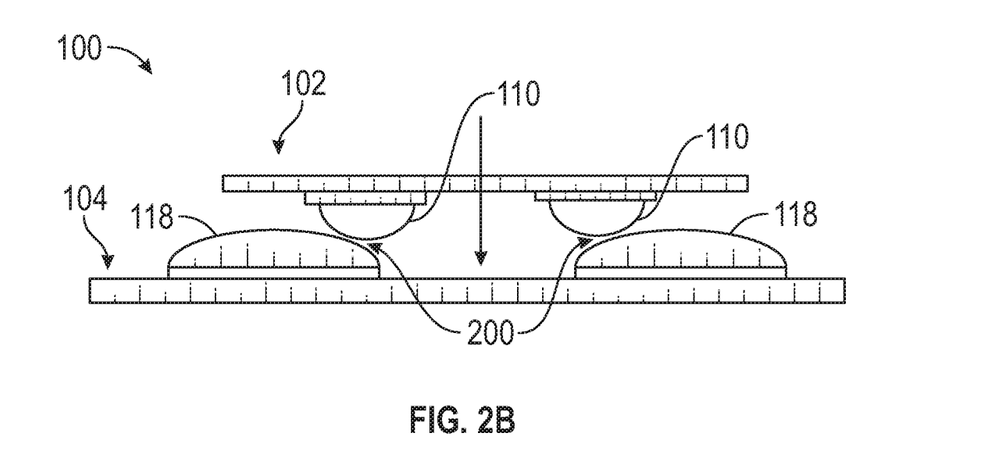

A connector 100 is shown in FIGS. 1, 2A, and 2B. FIG. 1 is a top plan view with partial transparency showing connector 100, which comprises in one embodiment a flexible connector 102 and a base connector 104. Flexible connector 102 and base connector 104 each have a plurality of solder bumps 110 and 118 respectively (see FIGS. 3-7) that align in an offset manner with one another to guide and position the flexible connector 102 and the base connector 104 with respect to one another so that the solder bumps align and form electrical connections therebetween.

FIGS. 2A and 2B show a side elevation view of a connection between flexible connector 102 and base connector 104. In FIG. 2A, the flexible connector 102 is moved from a top of base connector 104 toward the base connector 104. The solder bumps 110 of flexible connector 102 are in a pattern that fits inside a pattern of the solder bumps 118 of base connector 104. FIG. 2B shows when the flexible connector 102 meets the base connector 104, and the solder bumps 110 and 118 self-align to contact at contact points 200. It should be understood that while contact point is discussed, the contact may be along an arc, or another portion of the solder bumps 110 and 118, without departing from the scope of the disclosure.

Figure 3:
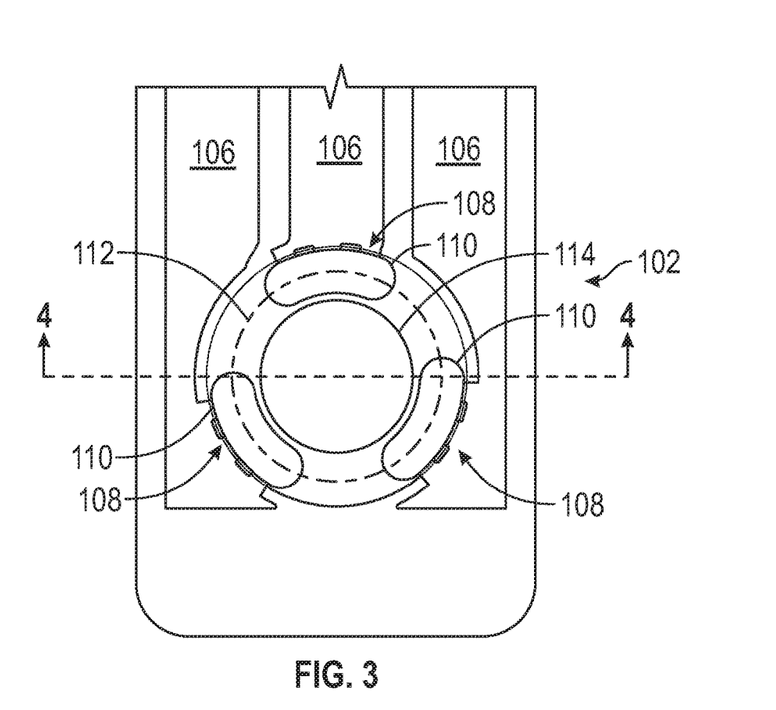
FIG. 3 is a plan view of a portion of a flexible connector according to an embodiment of the present disclosure.
Figure 4:
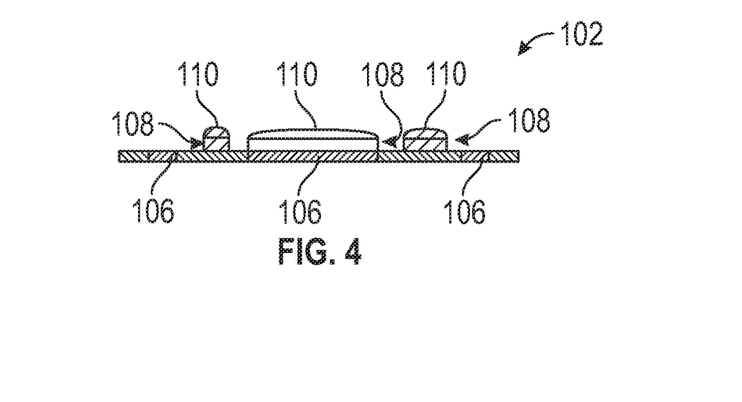
FIG. 4 is a view taken along lines 4-4 of FIG. 3.

Referring now also to FIGS. 3 and 4, flexible connector 102 is shown in further detail. FIG. 3 is a top plan view of a flexible connector 102. FIG. 4 is a view of flexible connector 102 taken along lines 4-4 thereof. Flexible connector 102 in one embodiment has a plurality of electrical connectors 106 electrically coupled to landpads 108. Landpads 108 accommodate solder bumps 110. In one embodiment, the solder bumps are a plurality of solder bumps arranged in a first pattern. The first pattern has, in one embodiment, the solder bumps 110 arrayed in a circular pattern, along a circular centerline 112 which runs through each of the solder bumps 110. In one embodiment, the solder bumps 110 have a reniform (e.g., kidney) shape as shown. It should be understood that different solder bump shapes may be used without departing from the scope of the disclosure, provided that they have the ability to align as discussed herein.

Figure 5:
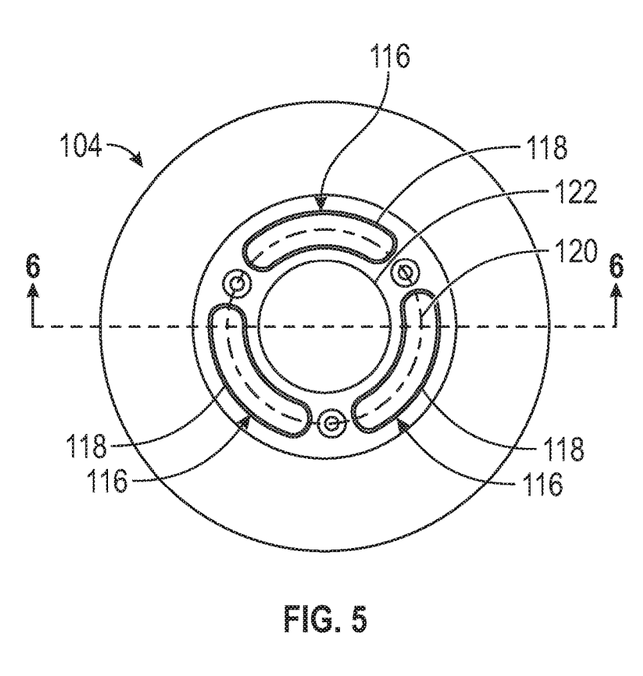
FIG. 5 is a plan view of a base connector according to an embodiment of the present disclosure.
Figure 6:
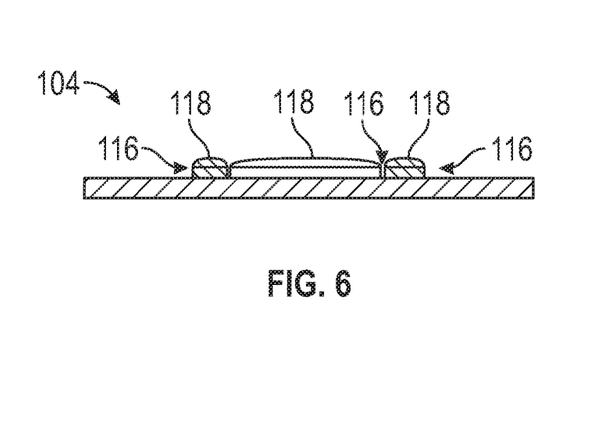
FIG. 6 is a view taken along lines 6-6 of FIG. 5.

Referring now also to FIGS. 5 and 6, base connector 104 is shown in further detail. FIG. 5 is a top plan view of a base connector 104. FIG. 6 is a view of base connector 104 taken along lines 5-5 thereof. Base connector 104 in one embodiment has a plurality of electrical connectors (not shown) electrically coupled to landpads 116. Landpads 116 accommodate solder bumps 118. In one embodiment, the solder bumps are a plurality of solder bumps arranged in a second pattern. The second pattern has, in one embodiment, the solder bumps 118 arrayed in a circular pattern similar to but of a different size than that of the first circular pattern, along a circular centerline 120 which runs through each of the solder bumps 118. In one embodiment, the solder bumps 118 have a reniform (e.g., kidney) shape as shown. It should be understood that different solder bump shapes may be used without departing from the scope of the disclosure, provided that they have the ability to align as discussed herein. In one embodiment, the base connector 104 is built into a PCB.

As shown, the first plurality of solder bumps 110 and the second plurality of solder bumps 118 each comprise three solder bumps. It should be understood that a different number of solder bumps could be used without departing from the scope of the disclosure as long as the alignment of the first and second pluralities of solder bumps remains. The first and second pluralities of solder bumps are also shown in a substantially circular pattern, with the centerlines 112 and 120 offset from each other to facilitate the alignment of the flexible connector 102 and the base connector 104. It should be understood that additional patterns may be used without departing from the scope of the disclosure.

In one embodiment, the first circular bump centerline 112 has a larger diameter than second circular bump centerline 120 such that when the flexible connector 102 is aligned with the base connector 104, the first and the second centerlines are concentric and align the first plurality of solder bumps 110 outside of and contacting the second plurality of solder bumps 118 when the flex connector and the base connector are pressed together. In another embodiment, the first circular bump centerline 112 has a smaller diameter than second circular bump centerline 120 such that when the flexible connector 102 is aligned with the base connector 104, the first and the second centerlines are concentric and align the first plurality of solder bumps 110 inside of and contacting the second plurality of solder bumps 118 when flex connector 102 and base connector 104 are pressed together.

Figure 7:
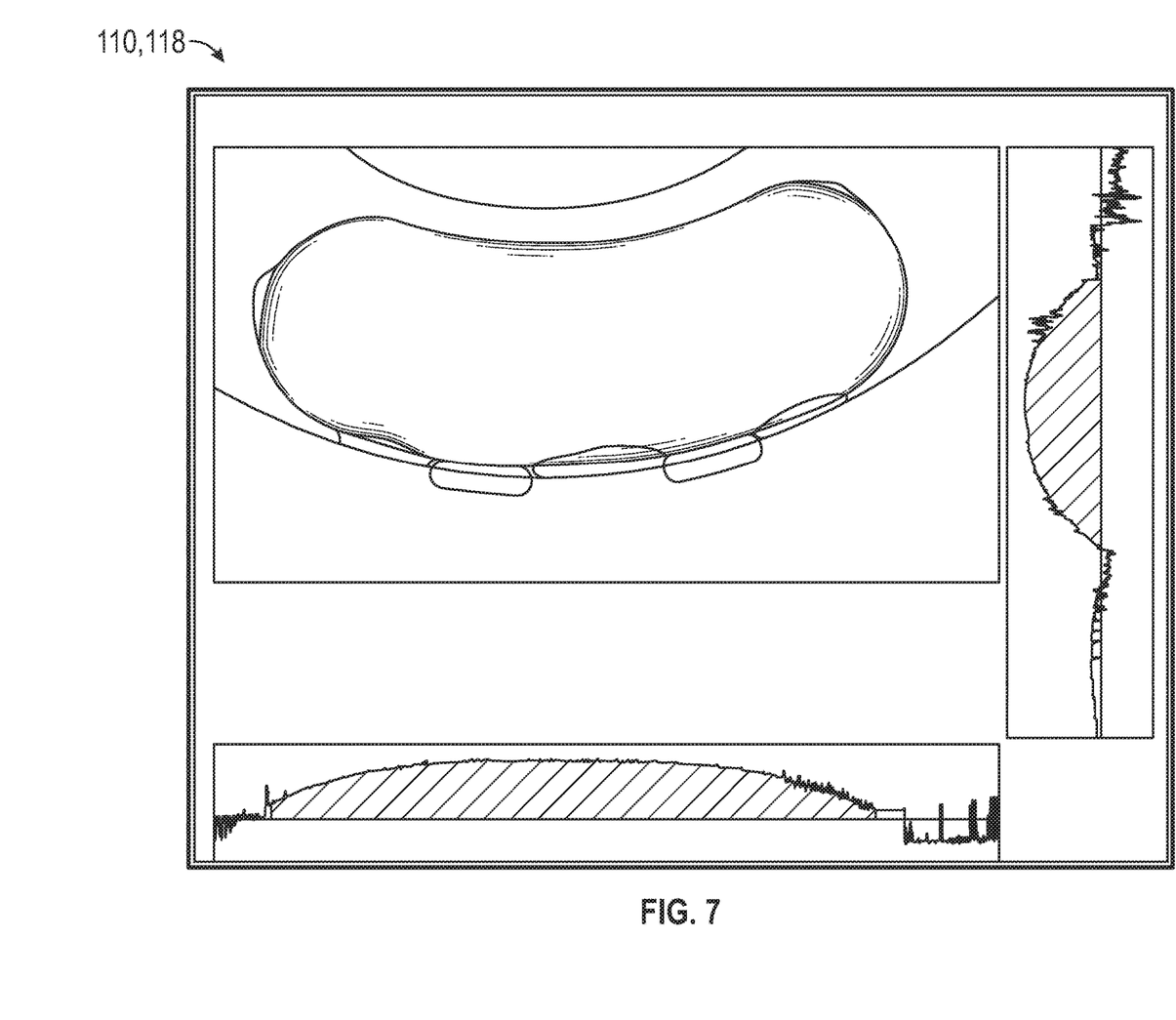
FIG. 7 is a view showing top, side, and end views of a solder bump according to an embodiment of the present disclosure.

FIG. 7 is a view showing top, end, and side views of a representative solder bump. In one embodiment, the first and second pluralities of solder bumps are substantially nondeformed when pressed together.

Figure 8:
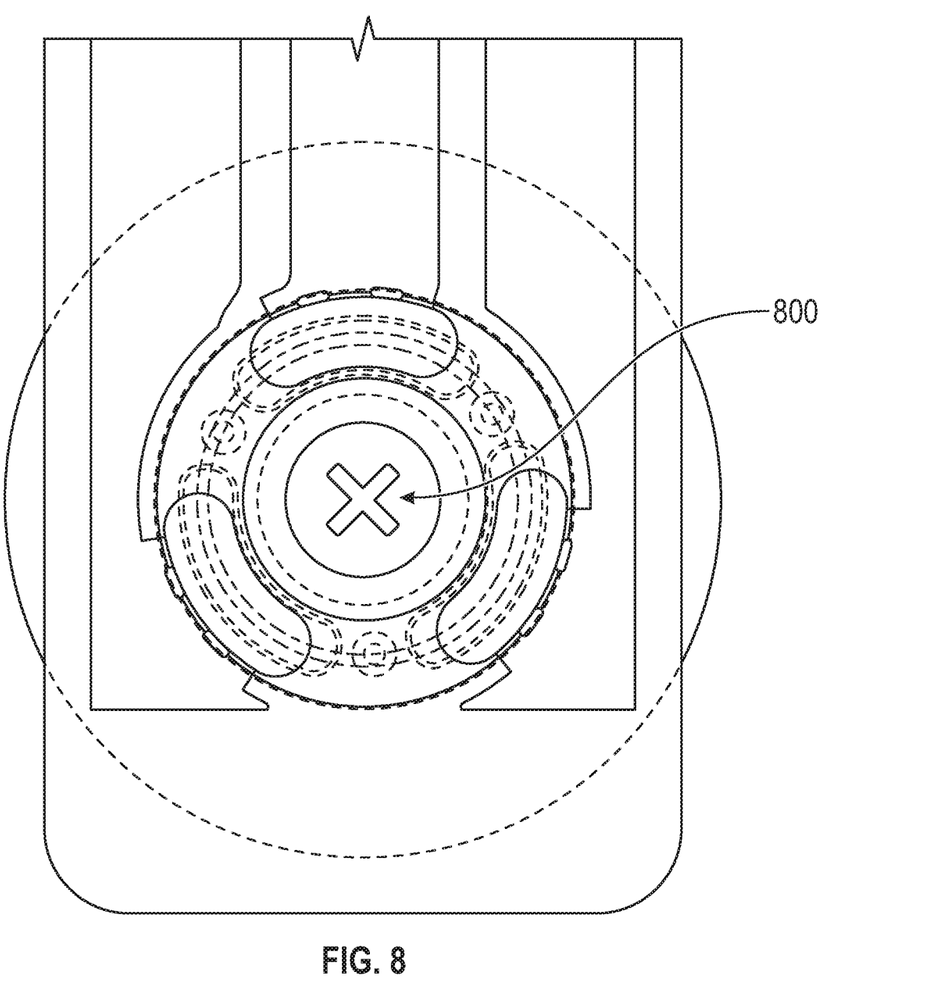
FIG. 8 is a plan view showing a compression of the flexible connector and base connector according to an embodiment of the present disclosure.

In one embodiment, the flexible connector 102 has an opening at a center of the first circular centerline pattern 112, and the base connector 104 has an opening 122 at a center of the second circular centerline pattern 120. The openings 114 and 122 are sized to fit a screw 800 (see FIG. 8) which effects a compression fit between the flexible connector and the base connector, to further secure the flexible connector and base connector together. The screw is fastenable through the openings 114 and 122 to press the first plurality of solder bumps 110 to the second plurality of solder bumps 118 to form an electrical connection therebetween. The center opening connection between the flexible connector 102 and the base connector 104 allows for a direct compression, saving space on a printed circuit board.

Figure 9:
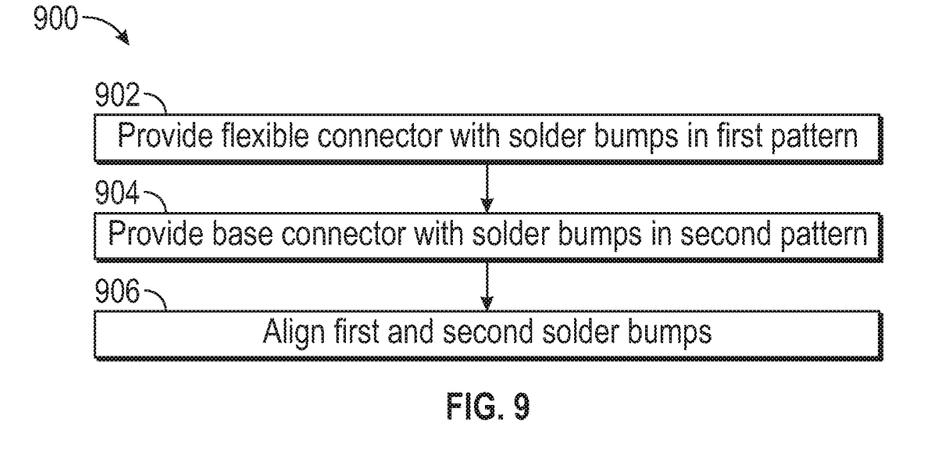
FIG. 9 is a flow chart diagram of a method according to an embodiment of the present disclosure.

In operation, a method 900 of interconnecting a flexible connector to a base connector is shown in flowchart form in FIG. 9. Method 900 comprises, in one embodiment, providing the flexible connector with a first plurality of solder bumps arranged in a first pattern in block 902, and providing the base connector with a second plurality of solder bumps arranged in a second pattern in block 904. In block 906, the flexible connector and the base connector are aligned. Alignment according to one embodiment includes providing the first plurality of solder bumps in a substantially circular pattern having a first circular centerline extending through each of the first plurality of solder bumps, and providing the second plurality of solder bumps in a substantially circular pattern, of a different size than the first circular pattern, having a second circular centerline extending through each of the second plurality of solder bumps. The second circular centerline may have a larger diameter or a smaller diameter than the first circular centerline, so that when the solder bumps are brought together, they self-align the flexible connector to the base connector.

In one embodiment, the flexible connector and base connector are compressed together by screwing the flexible connector and the base connector together with a screw in a center of the first and the second patterns.

Figure 10:
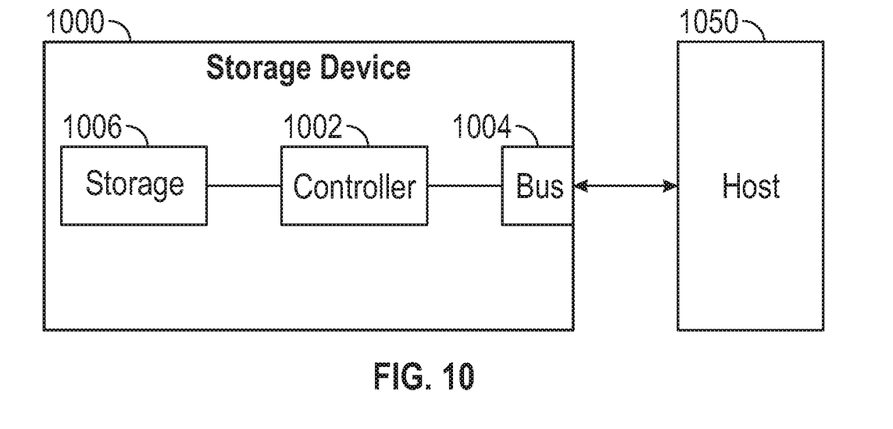
FIG. 10 is a block diagram of a data storage device on which embodiments of the present disclosure may be used.

Embodiments of the present disclosure may be used on storage devices for connection of a flexible connector to a base connector, or to a PCB having a base connector element, such as for example on a hard disc drive (HDD). Referring now to FIG. 10 a simplified block diagram of a storage system 1000 on which embodiments of the present disclosure may be practiced is shown. Storage system 1000 may be a HDD with platters, a read head, and associated controllers. System 1000 may include, by way of example, a controller 1002 coupleable via a bus 1004 or the like to a host system 1050, where the host system 1050 may provide power over the bus 1004 or through a separate power bus (not shown), and a storage component 1006 (such as a spinning disk or platter of disks). A graphics processor may be embodied within the storage device as computer readable instructions thereon for performing graphics processing. Alternatively, a separate graphics processor may be used.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be reduced. Accordingly, the disclosure and the figures are to be regarded as illustrative rather than restrictive.

One or more embodiments of the disclosure may be referred to herein, individually and/or collectively, by the term "invention" merely for convenience and without intending to limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments employ more features than are expressly recited in each claim. Rather, as the following claims reflect, inventive subject matter may be directed to less than all of the features of any of the disclosed embodiments.

The above-disclosed subject matter is to be considered illustrative, and not restrictive, and the appended claims are intended to cover all such modifications, enhancements, and other embodiments, which fall within the true scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A method of interconnecting a flexible connector to a base connector, comprising:
   providing the flexible connector with a first plurality of solder bumps arranged in a first circular pattern having a first circular centerline extending through each of the first plurality of solder bumps; and
   providing the base connector with a second plurality of solder bumps arranged in a second circular pattern having a second circular centerline extending through each of the second plurality of solder bumps, the second circular pattern having a different diameter than the first pattern; and
   aligning the flexible connector and the base connector by aligning the first and second pluralities of solder bumps.

2. The method of claim 1, and further comprising compressing the flexible connector and the base connector together to connect the first plurality of solder bumps and the second plurality of solder bumps.

3. The method of claim 2, wherein compressing comprises screwing the flexible connector and the base connector together with a screw in a center of the first and the second circular patterns.

4. The method of claim 1, the second circular centerline has a larger diameter than the first circular centerline.

5. The method of claim 1, wherein aligning the flexible connector and the base connector comprises:
   aligning the first plurality of solder bumps inside the second plurality of solder bumps; and
   compressing the first and second pluralities of solder bumps together.

6. The method of claim 5, wherein compressing the first and second pluralities of solder bumps together comprises:
   providing a first center hole at a center of the first circular bump centerline and a second center hole at a center of the second circular bump centerline; and
   fastening a screw through the first center hole and the second center hole to press the first plurality of solder bumps to the second plurality of solder bumps to form an electrical connection therebetween.

7. A connector, comprising:
   a flexible connector having a first plurality of solder bumps arranged in a first pattern, the first plurality of solder bumps arrayed on a first circular bump centerline; and
   a base connector having a second plurality of solder bumps arranged in a second pattern, the second plurality of solder bumps arrayed on a second circular bump centerline concentric with the first pattern, the second pattern having a different size than the first pattern;
   wherein the first circular bump centerline is smaller than the second circular bump centerline such that when the flexible connector is aligned with the base connector, the first and the second centerlines are concentric and align the first plurality of solder bumps inside of and contacting the second plurality of solder bumps when the flexible connector and the base connector are pressed together.

8. The connector of claim 7, wherein the second pattern is larger than the first pattern.

9. The connector of claim 7, wherein the second pattern is smaller than the first pattern.

10. The connector of claim 7, wherein the first plurality of solder bumps comprises three solder bumps.

11. The connector of claim 7, wherein the first plurality of solder bumps is arranged in a circular pattern.

12. The connector of claim 7, wherein the first plurality of solder bumps and the second plurality of solder bumps are reniform shaped.

13. The connector of claim 7, and further comprising:
   a center hole at a center of the first circular bump centerline and at a center of the second circular bump centerline; and
   a screw fastenable therethrough to press the first plurality of solder bumps to the second plurality of solder bumps to form an electrical connection therebetween.

14. The connector of claim 7, and further comprising:
   a first center hole in the flexible connector at a center of the first plurality of solder bumps;
   a second center hole in the base connector at a center of the second plurality of solder bumps; and
   a screw fastenable therethrough to press the first plurality of solder bumps to the second plurality of solder bumps to form an electrical connection therebetween.

15. The connector of claim 7, wherein the first and second plurality of solder bumps are substantially nondeformed when pressed together.

16. A flexible to printed circuit board connector, comprising:
   a flexible connector having a first plurality of solder bumps arranged in a first pattern, the first plurality of solder bumps arrayed on a first circular bump centerline; and
   a printed circuit board having a base connector;
   the base connector having a second plurality of solder bumps arranged in a second pattern, the second plurality of solder bumps arrayed on a second circular bump centerline concentric with the first pattern, the second pattern having a different size than the first pattern;

wherein the first circular bump centerline is smaller than the second circular bump centerline such that when the flexible connector is aligned with the base connector, the first and the second centerlines are concentric and align the first plurality of solder bumps inside of and contacting the second plurality of solder bumps when the flexible connector and the base connector are pressed to ether.

17. The flexible to printed circuit board connector of claim 16, and further comprising:
    a first center hole in the flexible connector at a center of the first plurality of solder bumps;
    a second center hole in the base connector at a center of the second plurality of solder bumps; and
    a screw fastenable therethrough to press the first plurality of solder bumps to the second plurality of solder bumps to form an electrical connection therebetween.

\* \* \* \* \*

UNITED STATES PATENT AND TRADEMARK OFFICE
CERTIFICATE OF CORRECTION

| | |
|---|---|
| PATENT NO. | : 11,387,583 B2 |
| APPLICATION NO. | : 17/024115 |
| DATED | : July 12, 2022 |
| INVENTOR(S) | : Brian Lee Burski et al. |

It is certified that error appears in the above-identified patent and that said Letters Patent is hereby corrected as shown below:

In the Claims

Column 5, Claim 4, Line 62, please insert the word --wherein-- between "1," and "the".

Signed and Sealed this
Thirtieth Day of August, 2022

Katherine Kelly Vidal
Director of the United States Patent and Trademark Office